United States Patent [19]

Shah et al.

[11] Patent Number: 4,800,525

[45] Date of Patent: Jan. 24, 1989

[54] DUAL ENDED FOLDED BIT LINE ARRANGEMENT AND ADDRESSING SCHEME

[75] Inventors: Ashwin H. Shah; Richard H. Womack, both of Dallas; Chu-Ping Wang, Carrollton, all of Tex.

[73] Assignee: Texas Instruments Incorporated, Dallas, Tex.

[21] Appl. No.: 83,911

[22] Filed: Aug. 6, 1987

Related U.S. Application Data

[63] Continuation of Ser. No. 666,854, Oct. 31, 1984, abandoned.

[51] Int. Cl.[4] .......................... G11C 5/06; G11C 7/00; G11C 8/00
[52] U.S. Cl. ...................................... 365/72; 365/230; 365/230.03; 365/210; 365/51
[58] Field of Search ............... 365/149, 189, 205, 207, 365/208, 230, 190, 210, 51, 72, 63, 233; 307/530

[56] References Cited

U.S. PATENT DOCUMENTS

| | | | |
|---|---|---|---|
| 4,367,540 | 1/1983 | Shimohigashi | 365/189 |
| 4,581,720 | 4/1986 | Takemae et al. | 365/189 |
| 4,590,588 | 5/1986 | Itoh et al. | 365/189 |

FOREIGN PATENT DOCUMENTS

| | | | |
|---|---|---|---|
| 0077083 | 6/1980 | Japan | 365/149 |
| 0082288 | 5/1982 | Japan | 365/210 |

*Primary Examiner*—Stuart N. Hecker
*Assistant Examiner*—Glenn A. Gossage
*Attorney, Agent, or Firm*—John D. Kling; Leo N Heiting; Melvin Sharp

[57] ABSTRACT

A scheme for addressing memory cells in random access memory arrays includes bit lines divided into a plurality of segments. Each pair of bit lines has a sense amp at each end coupled to both bit lines in the pair. Word lines address memory cells coupled to each bit line of the pair. When a pair of memory cells is accessed, the bit lines are electrically divided so that one memory cell is coupled to one sense amp through one bit line, and the other memory cell is coupled to the other sense amp through the other bit line. The memory cells can be coupled to the bit lines through segment lines, with each segment line connecting a subset of the memory cells to a bit line, in order to reduce capacitances presented to the sense amps. An alternating linear array of sense amps and bit line pairs can be used to increase overall density of the memory array by allowing sense amps to access more than one bit line pair. The bit lines are addressed so that each sense amp receives data from one one bit line pair at a time. Segment lines having no currently addressed memory cells can be coupled to the sense amps in order to better balance input capacitances presented thereto. Selecting the bit line sections, segments, and memory cells in the proper order minimizes the effect of noise due to stray capacitances by causing them to appear as a common mode signal across the bit line pairs.

9 Claims, 5 Drawing Sheets

DUAL ENDED FOLDED BIT LINE ARRANGEMENT AND ADDRESSING SCHEME

This application is a continuation of application Ser. No. 666,854, filed Oct. 31, 1984, now abandoned.

This application is related to copending U.S. application entitled "Dual Ended Adaptive Folded Bit Line" Ser. No. 666,851, by Shah and Womack, filed Oct. 31, 1984, and U.S. application entitled "Dummy Segment for Dual Ended Adaptive Folded Bit Line" by Shah and Womack, Ser. No. 666,855, filed Oct. 31, 1984, both of which are assigned to the assignee of the present application, both now abandoned.

BACKGROUND AND SUMMARY OF THE INVENTION

The present invention relates to improved layout and operating schemes for integrated circuit dynamic random access memories.

In the design of sense amplifiers for dynamic random access memories (DRAMs), a common technique referred to as folded bit lines is used to increase the signal to noise ratio. In that scheme, the small voltage to be sensed is developed between two parallel bit lines. The purpose behind such scheme is to minimize any differential signal presented to the sense amps by noise or process variations. By laying the bit lines close together and matching them geometrically, most noise will be seen by the sense amp as a common mode signal. Since the sense amps are designed to detect differential voltages, such common mode noise signals do not affect the reading of data.

A key circumstance which allows the implementation of such a folded bit line approach is the ability to run two word lines within one memory cell pitch. Only one memory cell's charge can be sensed on a single bit line. The two parallel bit lines are each generally considered to be half of a bit line, and only one bit of data can be sensed per whole bit line. Because the bit line is folded into two parallel half bit lines, adjacent cells on the separate halves of a bit line must be addressed by separate word lines. Such an addressing scheme is shown in FIG. 1. If the memory cell size is shrunk below twice the word line pitch, either the folded bit line scheme cannot be used or unused blank area must be left within the memory cell array.

It is therefore an object of the present invention to provide an improved layout and signal connection scheme whereby differential sensing such as found in folded bit lines can be used with small memory cells. It is another object of the present invention to improve the packing density of large arrays of small memory cells.

Therefore, in accordance with the present invention, two parallel bit lines have differential sense amplifiers on both ends. Adjacent memory cells on the parallel bit lines are addressed by a single word line. Both bit lines are electrically broken by pass transistors, so that one bit line couples one memory cell to one sense amp, and the other bit line couples the other memory cell to the other sense amp. Using this scheme, two bits are accessed by a single word line. In order to decrease undesirable capacitances, memory cells may be grouped into segments which are selectively coupled to the bit lines. Only the segment containing the selected memory cell is coupled to the bitline when that cell is read, so that only the capacitance of one segment line plus the bit line is presented to the sense amplifier. A repetitive linear pattern of bit lines and sense amps allows each sense amp to detect signals from bit lines on either side, although not simultaneously.

In order to more accurately balance the impedances presented to the sense amps, a segment in a currently non-selected portion of the array can be coupled to a sense amp to balance the impedance of a selected segment containing the selected memory cell.

In order to reduce differential mode noise signals caused by stray capacitances between crossing signal lines, the various select transistors should be selected in a controlled pattern.

The novel features which characterize the present invention are defined by the appended claims. The foregoing and other objects and advantages of the present invention will hereinafter appear, and for purposes of illustration, but not of limitation, several preferred embodiments are shown in the accompanying drawings.

DESCRIPTION OF THE PREFERRED EMBODIMENTS

Figure 1:
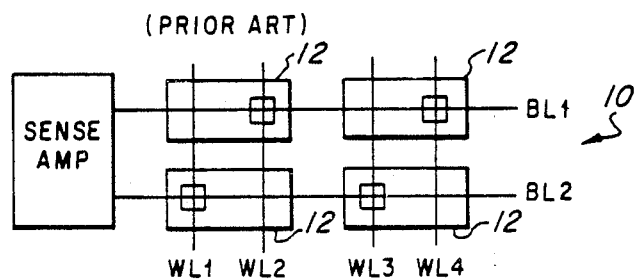
FIG. 1 shows a portion of a dynamic RAM array using a prior art folded bit line scheme.

Referring to FIG. 1, a small portion of a dynamic random access memory (DRAM) array 10 is shown. FIG. 1 illustrates a prior art folded bit line sensing approach, utilizing a sense amplifier coupled to two parallel rows of memory cells 12. As shown, memory cells 12 are large enough that two word lines WL1,WL2,WL3,WL4 may be laid down above each cell 12. Alternate word lines WL1,WL2,WL3,WL4 will only make connection with the cells in the upper or lower rows. Here, the first and third word lines WL1,WL3 are coupled with the lower bit line BL2, and the second and fourth word lines WL2,WL4 are contacted with the upper bit line BL1. Only one word line will be activated at a time, so that a signal appears on the lower or upper bit line, but not both simultaneously. A similar arrangement would have the memory cells 12 running lengthwise under the word lines instead of the bit lines, but the packing density and operation would be basically identical.

Figure 2:
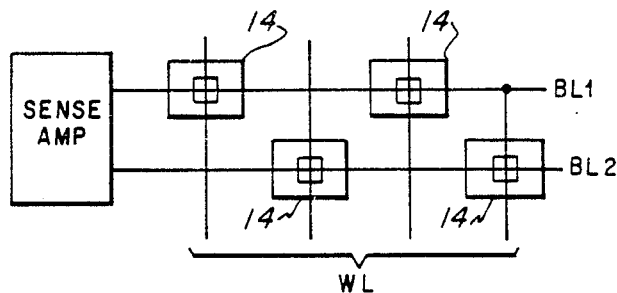
FIG. 2 shows a portion of a dynamic RAM array using a folded bit line scheme and smaller memory cells.

Referring to FIG. 2, a folded bit line sense amp again addresses two parallel bit lines BL1,BL2. Each bit line BL1,BL2 is connectable to a memory cell 14 with a single word line WL. In FIG. 2, the surface area of each memory cell 14 is much smaller than that of the cells 12 shown in FIG. 1. Such smaller surface area can be achieved by any of several techniques known in the art, and this small cell size would be typical of those found on high density DRAMs, such as those having a capacity of greater than one megabit per chip. It will be seen in FIG. 2 that approximately one-half of the surface area available for the cell array is wasted because of minimum spacing restrictions on both the word lines WL and bit lines BL1,BL2.

Figure 3:
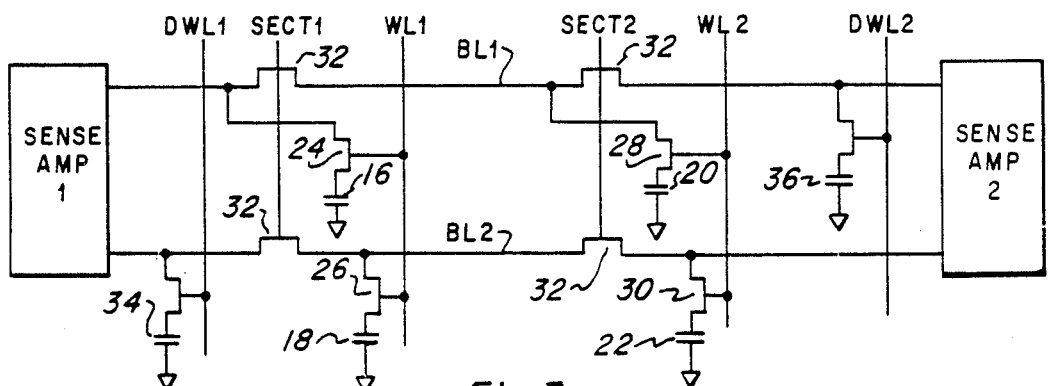
FIG. 3 is a partial schematic diagram of a dual ended adaptive folded bit line scheme according to the present invention.

Referring to FIG. 3, a technique for addressing memory cells which allows increased array density is shown. This technique uses parallel first and second bit lines BL1,BL2 having a sense amp at each end. In this scheme, a single word line WL1,WL2 addresses two adjacent memory cells 16,18,20,22 which are coupled to different bit lines. In the drawing of FIG. 2, this would mean that four additional memory cells could be interspersed in that portion of the array which is shown. In this manner, no further reduction is required of the spacing between adjacent word lines WL and bit lines BL. The schematic of FIG. 3 shows a DRAM array having only four cells 16,18,20,22, which are addressed in pairs by WL1 and WL2. Between the connections of the various cell select transistors 24,26,28,30 and the bit lines, section select gates 32 divide each bit line into sections. A dummy cell 34, 36 is attached to each bit line, and the two cells shown are addressed by dummy word lines DWL1 and DWL2.

The word line WL1,WL2 and dummy word line DWL1,DWL2 signals are normally low, so that no memory cells are selected. The first and second section select signals SECT 1, SECT 2 are normally high, so that each bit line is a complete low impedance path between sense amps 1 and 2. When it is desired to address a pair of memory cells, the appropriate word line signal WL goes high, and a section select signal SECT goes low. This has the effect of dividing each bit line into two parts. One bitline, in this case BL2, will couple the selected memory cell to sense amp No. 2, while BL1 will couple the selected memory cell to sense amp No. 1. The effect is as if two separate folded bit line groupings and sense amps were present.

For example, assume that memory cells 16 and 18 are to be addressed. WL1 goes high, and the signal SECT 1 goes low. This couples memory cell 16 to sense amp 1, with memory cell 18 being connected to sense amp 2. Both dummy word lines DWL1,2 are also driven high, so that the respective dummy cells 34,36 are connected to the appropriate bit lines BL2,BL1. In this example, sense amp 1 will sense the value stored in memory cell 16 by comparing it with the reference charge in dummy cell 34, while sense amp 2 will read the value from memory cell 18 by comparing with the reference charge stored on dummy cell 36.

In order to sense the data in memory cells 20 and 22, SECT 2 would go low, while SECT 1 would remain high. All section select signals are normally high, with one signal going low in order to break both bit lines at that point and send one bit of information to each sense amp. WL2 would go high to select memory cells 20 and 22.

Figure 4:
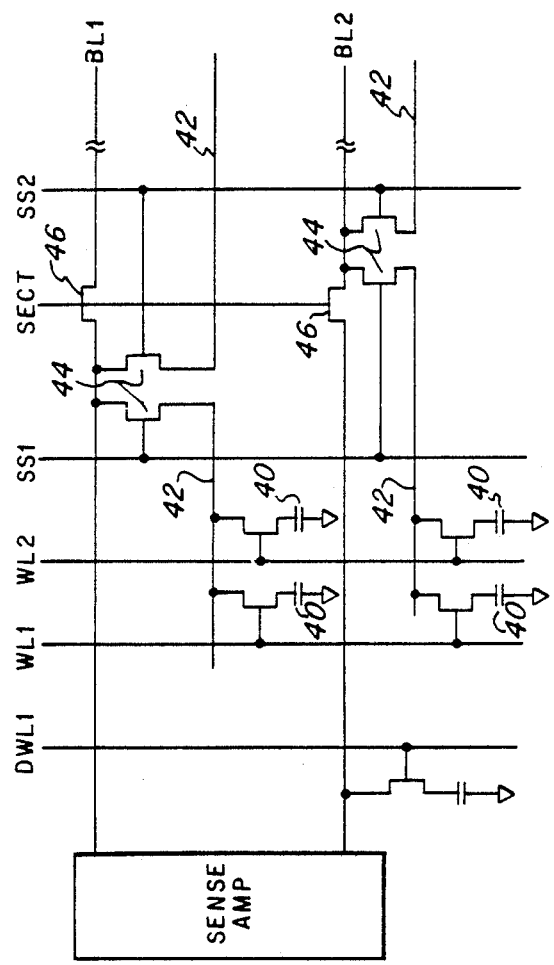
FIG. 4 is a portion of a dynamic RAM array illustrating segment addressing in conjunction with a dual ended adaptive folded bit line scheme.

Referring to FIG. 4, an interconnect scheme for grouping memory cells 40 into segments is shown. Instead of coupling each memory cell 40 directly to a bit line BL1,BL2, the memory cells are preferably coupled to segment lines 42, with each segment 42 being coupled to the bit line BL1 or BL2 through segment select transistors 44. This allows the memory cells 40 to be coupled to diffused segment lines 42, which increases packing density, while the bit lines themselves BL1,BL2 are metal, which decreases bit line capacitance. This decreases the overall capacitance encountered when sensing a selected cell 40 and allows use of a smaller number of section select transistors 46. The signals necessary to couple a given memory cell 40 to the appropriate sense amp include the word line select signals WL1 or WL2, the appropriate segment select signal SS1 or SS2, and the appropriate section select signal SECT. In addition, a dummy word line DWL must be selected to give a reference voltage for the sense amp.

In the preferred embodiment, 64 memory cells 40 are coupled to each segment line 42, with two segment lines 42 being coupled to the bit line at a single node on the appropriate side of the segment select transistor 46. Alternatively, 4 or more segment lines 42 could be coupled together, which would require an equal number of segment select (SS) lines.

Figure 5:
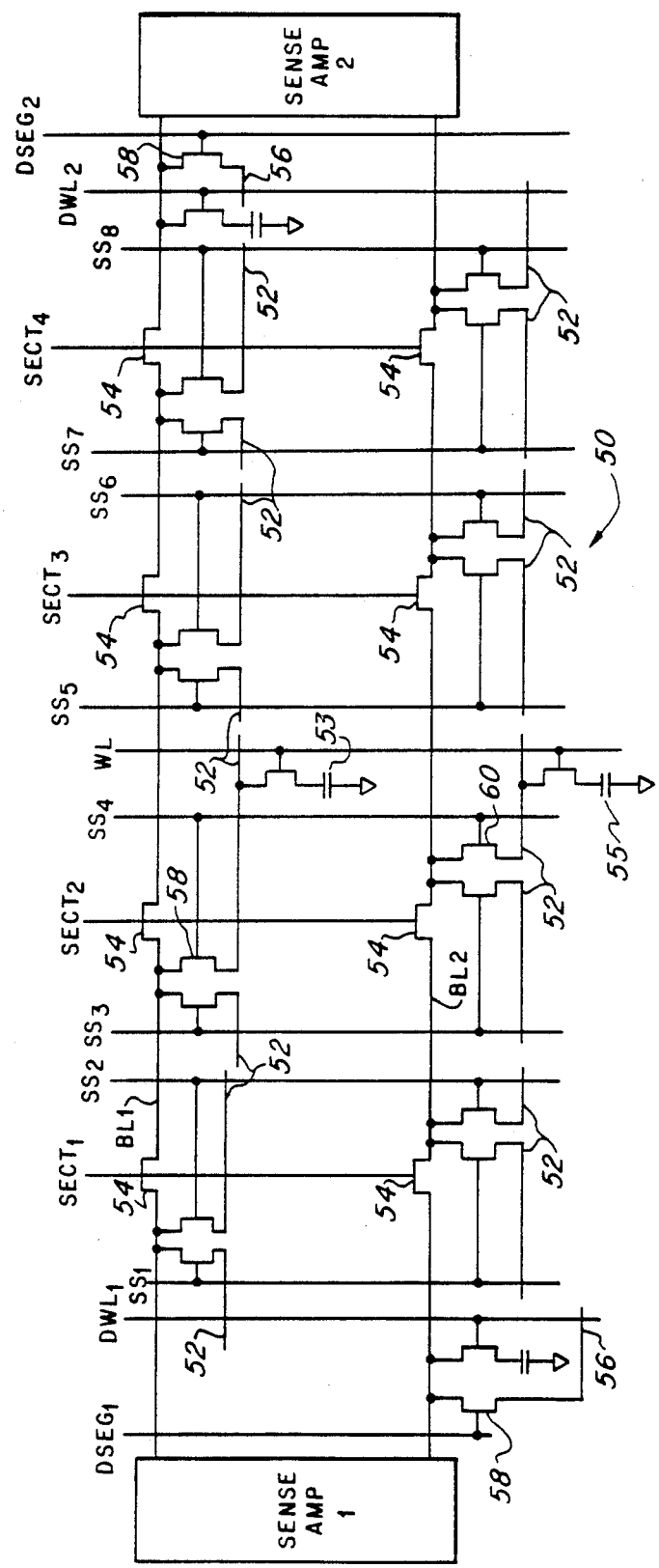
FIG. 5 is a partial schematic diagram of a dynamic RAM array in accordance with the present invention.

Referring to FIG. 5, a preferred layout scheme for a large memory array 50 is shown in accordance with the above-described techniques. Eight segment lines 52, each containing 64 memory cells 53,55, are coupled to each bit line BL1,BL2. Segment lines 52 are coupled n pairs to single nodes on the bit line BL1,BL2, so that four section select transistors 54 are needed to divide each bitline as described above. 512 memory cells 53,55 are therefore coupled to each bitline BL1,BL2, giving 1024 bits of memory in the array between two sense amps.

If it is desired that the sense amps be completely balanced, dummy segments 56 may be coupled to each bit line BL1,BL2 through a dummy segment select transistor 58. These dummy segments 56 do not hold information, but will have a capacitance equal to that of any selected segment 52 which is coupled to the bit line BL1,BL2. With basically identical capacitances coupled to each side of each sense amp, the logical value of a selected memory cell 53,55 can be sensed with an improved signal to noise ratio, resulting in greater reliability and increased tolerance to supply voltage variations. However, the use of dummy segments 56 results in a substantial area penalty, which may not be desirable. The use of such dummy segments 56 may not be required in all implementations.

In order to read data, at least four signals must change state. As shown in FIG. 5, these include the word line select WL, which selects the individual memory cells 53,55 to be read, the appropriate segment select signal SS, which is SS4 for shown memory cells 53,55, the appropriate section select signal SECT, which for the example shown is SECT 2, and both dummy word line signals DWL1,DWL2. Dummy segment select signals DSEG 1, DSEG 2 must also be activated if dummy segments 56 are included. Except for the section select signals SECT, all signals are normally low and go high when selected. The section select signals SECT are normally high, and go low in order to turn off the selected section transistor 54. Note that this is the case for n-channel transistors; if p-channel section select transistors 54 are used, the section select signals are normally low and go high when selected. Alternatively, a CMOS pass gate could be used in place of the section select transistors 54.

When SECT 2 goes low, both bit lines BL1,BL2 are divided into two pieces, with one piece of each bit line carrying the data signal to one sense amp, and the other piece serving as a reference bit line for the other, differential, sense amp. The signal from memory cell 53 being coupled through segment select transistor 58 and a portion of BL1 to sense amp 1. Memory cell 55 is coupled to the BL2 through segment select transistor 60, and then to sense amp 2. Thus, two data bits are read by selecting a single word line WL, with an output being available at each sense amp.

The layout scheme of FIG. 5 results in nearly a twofold packing density increase within the data array 50. However, two sense amps incur an area penalty on the integrated circuit chip as opposed to a single sense amp. In order to minimize such area penalty while retaining the benefits of the scheme described above, a preferred chip layout is shown in FIG. 6. As will be described, this layout allows four out of five sense amps to be active simultaneously, thus decreasing the penalty incurred by use of sense amps at both ends of each bit line.

Figure 6:
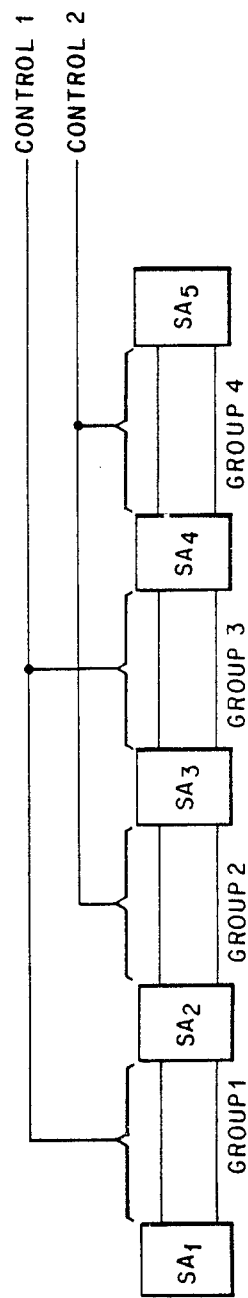
FIG. 6 is a block diagram illustrating an extended dynamic RAM array in accordance with the present invention.

Referring to FIG. 6, the pattern of FIG. 5 is repeated four times, with the three interior sense amps having inputs on both sides. The word lines, segment select lines and section select lines, together identified as CONTROL 1 and CONTROL 2 are routed through the array so that each sense amp will only be sensing a signal on one side at a time. Thus, the memory cells of group 1 and group 3 are driven by common signals CONTROL 1, and the memory cells of group 2 and group 4 are driven by signals control 2. When group one and group three are selected, SA1 and SA2 each detect one bit from group 1, as described in connection with FIG. 5, with SA3 and SA4 each detecting one bit from group three. SA5 is idle. All word line and segment select signals in Control 2 are low, so that no transistors in group 2 or group 4 are activated. The section select signals closest to the sense amps are also low, so that the bit lines in the deselected group are disconnected. Therefore, no signal is presented to SA2 or SA3 from the memory cells in group two, and no signal is presented to SA4 from the memory cells in group four.

A similar situation is encountered when group two and group four are selected, with all signals CONTROL 1 being as described above for CONTROL 2. This causes bits to be sensed from group two by SA2 and SA3, and two bits to be sensed from group four by SA4 and SA5. SA1 is idle.

It will be seen that the scheme described above allows sensing of four bits simultaneously out of a 1024 bit array, and allows the sense amps to be used more efficiently.

The dummy segments 56 described in conjunction with FIG. 5 incur a large area penalty on the chip. This penalty is inconsistent with the packing density necessary to achieve large capacity DRAMs. However, leaving off the dummy segments 56 unbalances the capacitances into each sense amp, thereby decreasing the signal to noise ratio.

Figure 7:
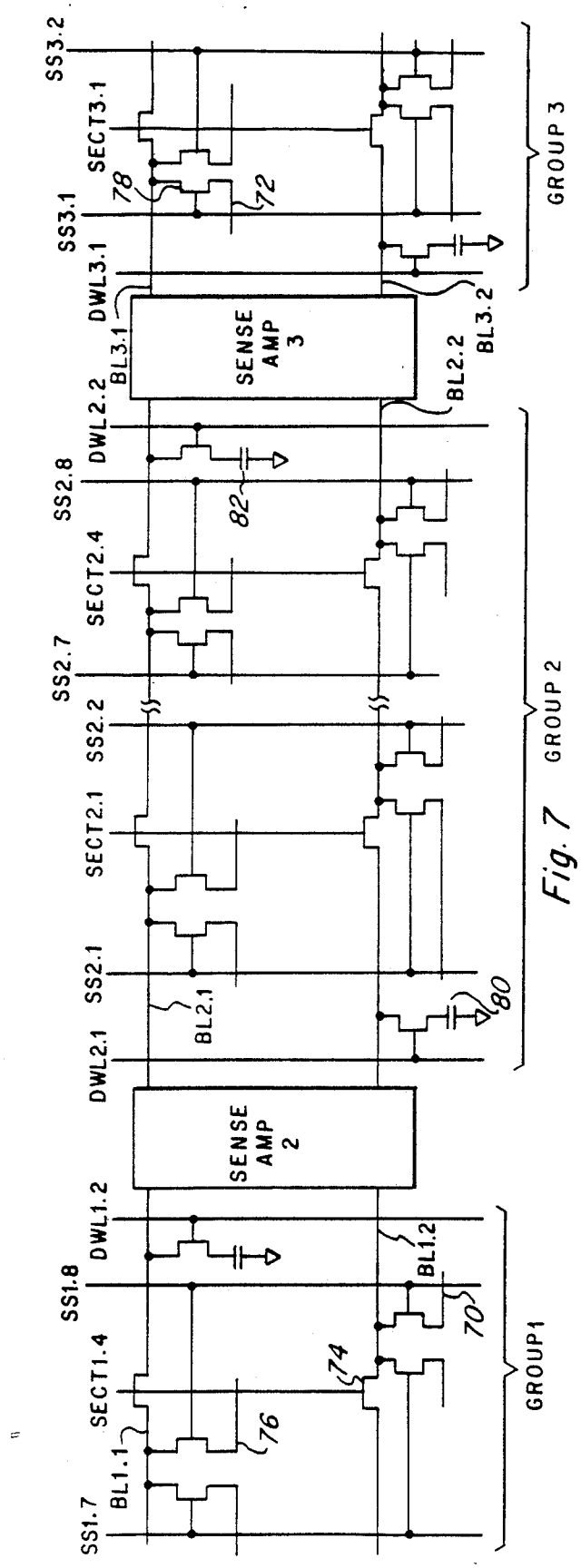
FIG. 7 is a partial schematic diagram of a dynamic RAM memory array according to the present invention which provides for using an unaddressed segment of memory cells to balance a sense amplifier.

Referring to FIG. 7, a layout scheme for precisely balancing the capacitances to each sense amp without incurring the extra area penalty due to dummy segments is shown. This scheme makes use of one segment from the group on the deselected side of the sense amp. As shown in FIG. 7, when group 2 is selected, groups 1 and 3 are deselected as described in connection with FIG. 6. This means that the section select signals SECT 1.4, SECT 3.1 are low, as are segment select signals SS1.7 and SS3.2. However, one segment signal on each nonselected group is selected, which couples one unused segment to the sense amp in order to balance the capacitance of the segment line containing the selected memory cell.

When a pair of data cells is selected in group 2 as described above, the bit line BL2.1 is coupled to sense amp 2 and BL2.2 is coupled to sense amp 3. Group one segment select signal, SS1.8, is also driven high, so that segment 70 is coupled to BL1.2. Since SECT 1.4 is low, any signals to the left of section select transistor 74 will not be coupled to sense amp 2. Also, segment 76, coupled to the BL1.1 is not coupled to sense amp 2. Thus, one segment 70 on an unused group is used to balance the selected segment coupled to BL2.1.

Sense amp 3 is treated in a similar manner. Since the selected memory cell will be coupled to sense amp 3 on the bit line BL2.2, group 3 segment select transistor 78 is turned on by driving SS3.1 high in order to couple segment 72 to the bit line BL3.1 of sense amp 3. This will balance the impedances presented to the sense amp along BL2.2. Note that no word lines are activated in groups 1 or 3, so that no false data signals are connected to the sense amps; the selected segments 70,72 from groups 1 and 3 are coupled to sense amps 2 and 3 as dummy segments only in order to balance the capacitances seen by the sense amps.

Sense amp 2 will see the capacitance of one segment, plus one data cell, plus BL2.1, balanced with the capacitance of one segment 70, plus the dummy cell 80, plus the bit line BL2.2, BL1.2 and BL2.2 are connected to each other through sense amp 2. The sense amp is not required to determine which side holds a valid input signal; such decision is made by activating the correct section and segment select signals. Thus, sense amp 2 is precisely balanced, and will read the selected memory cell with a very high signal to noise ratio. Likewise, sense amp 3 is coupled to the capacitance of one selected segment, plus one selected memory cell, plus the bitline BL2.2, balanced with one dummy selected segment, one dummy cell, and the bit line BL2.1. As before, BL2.1 and BL3.1 are directly coupled together in sense amp 3.

When the layout scheme of FIG. 6 is used, one dummy segment must be coupled to sense amp 1 on the lower bit line, and to sense amp 5 on the upper bit line, since no unused segments are already coupled to sense amps 1 and 5 in these locations. If FIG. 6 were to be extended to eight groups, thus using nine sense amps, the first and ninth sense amps would need one dummy segment apiece so as to be balanced during sensing. When FIGS. 6 and 7 are combined, only two dummy segments are needed, which is a small penalty to pay in terms of area in order to gain the improved sensitivity of balanced sense amps.

It is desirable to keep the noise presented to the sense amps to the lowest possible value in order to improve the signal to noise ratio. Stray capacitances, such as those caused where information lines cross, is a factor which degrades the signal to noise ratio.

Figure 8:
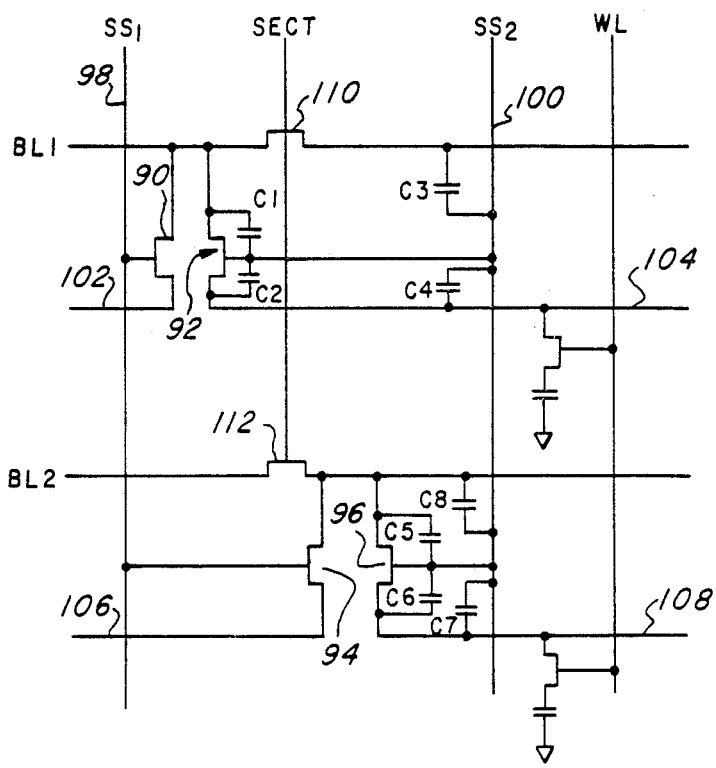
FIG. 8 is a schematic diagram of a portion of a dynamic RAM array illustrating parasitic capacitances.

Referring to FIG. 8, several important stray capacitances are illustrated. Other stray capacitances will of course be present, but are not illustrated because they are not important to the present discussion. The stray capacitances of interest are the gate to source and drain capacitances $C_1, C_2, C_5, C_6$ on the segment select transistors 92,96 and the stray capacitances between the segment select line 100 and the bit lines BL1,BL2 and segment lines 104,108 which they cross. The capacitances C2 and C4 are seen to be in parallel, as are the capacitances C1 and C3 when the section select transistor 92 is on. When the section select transistor 110 is off, however, these latter two stray capacitances C1 and C3 are no longer in parallel, which may introduce extra noise into the line. If the section select transistors 110,112 are turned off before the segment select transistors 92,96 are turned on, different charges, or noise, can be sent to the left side of BL1 and the right side of BL2. This tends to adversely affect the sense amps across BL1 and BL2.

In general, the correct section select transistor 110,112 must be turned off before the word line signal selects the desired memory cells. This allows any noise which is present on BL1 or BL2 to equalize on either side of section select transistors 110 and 112. Any stray charge introduced along segment select line 100 will become balanced between B11 and B12. This common mode noise signal will not adversely affect the operation of the sense amps. If the section select transistors 110,112 are turned off before segment select transistors 92,96 are turned on, this balancing effect will not take place.

Figure 9:
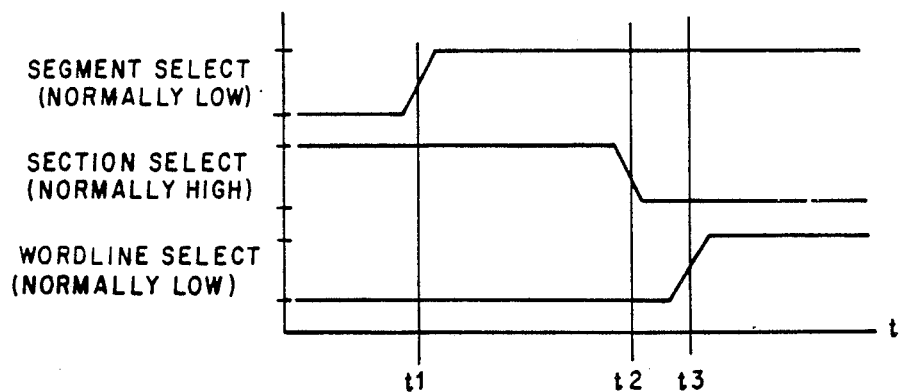
FIG. 9 is a timing diagram for use with the structure of FIG. 8.

In order to overcome this problem, it is necessary to activate the segment select signal SS1,SS2 prior to turning the section select transistors 110,112 off. Time must be allowed for the noise signals to become common mode, at which point the section select transistors 110,112 can be turned off. The timing diagram which causes all select transistors to function as desired is shown in FIG. 9. The segment select signal SS1 or SS2, which is normally low, is driven high at time t1. After a suitable delay, which will depend almost entirely upon the amount of noise introduced, which is itself a function of the process used to build the integrated circuit, the section select signal SECT is driven low at time t2. As soon as the section select signal SECT is low, the word line select WL is driven high at time t3. The timing diagram of FIG. 9 can be implemented using standard logic in a known manner.

When the select transistors are activated as shown in FIG. 9, any noise signals which occur due to stray capacitances caused by crossovers of segment select lines with bit lines or segment lines will balance out prior to the section transistor being selected. This insures that stray signals are always coupled to the sense amps in common mode, which does not interfere with the reading of data stored in the selected memory cells.

The present invention has been illustrated by the methods and structures described above, and it will become apparent to those skilled in the art that various modifications and alterations may be made thereto. Such variations fall within the ambit of the present invention, the scope of which is defined by the appended claims.

What is claimed is:

1. A memory circuit comprising:
   a first bit line separated into segments 1 through N, each segment having a section line connected thereto through a section select transistor and at least one memory cell connected to each of said section lines;
   a second bit line separated into segments 1 through N−1, each segment having a section line connected thereto through a section select transistor and at least one memory cell connected to each of said section lines;
   a first plurality of switching means 1 through N, wherein a second terminal of said 1st switching means of said first plurality of switching means is connected to a first end of said 1st segment of said first bit line and said 2nd through Nth switching means of said first plurality of switching means are connected so that the second terminal of the Lth switching means of said first plurality of switching means is connected to the first end of the Lth segment of said first bit line and the first terminal of said Lth switching means of said first plurality of switching means is connected to the second end of the Lth−1 segment of said first bit line;
   a second plurality of switching means 1 through N, wherein a first terminal of said Nth switching means of said second plurality of switching means is connected to a second end of said Nth−1 segment of said second bit line and said 1st through Nth−1 switching means of said second plurality of switching means are connected so that the first terminal of the Lth switching means of said second plurality of switching means is connected to the second end of the Lth−1 segment of said second bit line and the second terminal of said Lth switching means of said second plurality of switching means is connected to the first end of the Lth segment of said second bit line;
   a first sense amplifier connected to a first terminal of said 1st switching means of said first plurality of switching means and said first sense amplifier being connected to the first end of said 0th segment of said second bit line;
   a second sense amplifier connected to a second terminal said Nth switching means of said second plurality of switching means and said second sense amplifier being connected to the second end of said Nth segment of said first bit line;
   a plurality of word lines running perpendicular to said first and second bit lines, said word lines which are connected to a memory cell connected to the Xth segment of said first bit line being connected to a memory cell connected to the Xth−1 segment of said second bit line;
   a plurality of control lines 1 through N running parallel to said word lines, connected so that a control line connected to a control terminal of the Yth switching means of said first plurality of switching means is also connected to a control terminal of the Yth switching means of said second plurality of switching means;
   a plurality of section control lines 1 through N running parallel to said word lines, connected so that a section control line connected to a control terminal of the section select transistor of the Zth segment of said first bit line is also connected to a control terminal of the section select transistor of the Zth−1 segment of said second bit line; and
   means for generating, in order, a segment select signal for making conductive the ones of said first and second pluralities of switching means connected to a selected one of said control lines, a section select signal provided on a selected one of said section control lines, said section control signal being provided a sufficient time after said segment select signal to allow the noise on said first and second bit lines to diminish to common mode noise, and a word select signal provided on a selected one of said word lines.

2. The memory of claim 1 further comprising a first dummy memory cell connected to the second terminal of said 1st switching means of said first plurality of switching means and a second dummy memory cell connected to the second terminal of said Nth switching means of said second plurality of switching means.

3. The memory of claim 1 wherein each of said memory cells comprises a single transistor and a single capacitor wherein the drain of the transistor is connected to a corresponding bit line, the source of the transistor is connected to one plate of the capacitor, the gate of the transistor is connected to a corresponding word line, and a second plate of the capacitor is connected to a reference potential.

4. The memory of claim 1 wherein each of said switching means is a pass transistor and the first and second terminals are the source and drain of the pass transistor and the control terminal is the gate of the pass transistor.

5. The memory of claim 4 wherein each of said switching means is a pass transistor and the first and second terminals are the source and drain of the pass transistor and the control terminal is the gate of the pass transistor.

6. The memory of claim 4 wherein each of said memory cells comprises a single transistor and a single capacitor wherein the drain of the transistor is connected to a corresponding bit line, the source of the transistor is connected to one plate of the capacitor, the gate of the transistor is connected to a corresponding word line, and a second plate of the capacitor is connected to a reference potential.

7. A memory circuit comprising:
a first bit line separated into segments 1 through N, each segment having at least one memory cell connected thereto;
a second bit line parallel to said first bit line, said second bit line separated into segments 0 through N−1, each segment having at least one memory cell connected thereto;
a first plurality of switching means 1 through N, wherein a second terminal of said 1st switching means of said first plurality of switching means is connected to a first end of said 1st segment of said first bit line and said 2nd through Nth switching means of said first plurality of switching means are connected so that the Lth switching means of said first plurality of switching means has a first terminal connected to a second end of the Lth−1 segment of said first bit line and a second terminal connected to a first end of the Lth segment of said first bit line;
a second plurality of switching means 1 through N, wherein a first terminal of said Nth switching means of said second plurality of switching means is connected to a second end of said Nth−1 segment of said second bit line and said 1st through Nth−1 switching means of said second plurality of switching means are connected so that the Mth switching means of said second plurality of switching means has a second terminal connected to a first end of the Mth segment of said second bit line and a first terminal connected to a second end of the Mth−1 segment of said second bit line;
a sense amplifier connected to a first terminal of said 1st switching means of said first plurality of switching means and said sense amplifier being connected to a first end of said 0th segment of said second bit line;
a plurality of word lines running perpendicular to said first and second bit lines, each of said word lines connected so that a word line connected to a memory cell which is connected to the Xth segment of said first bit line is also connected to a memory cell connected to the Xth−1 segment of said second bit line; and
a plurality of control lines 1 through N running parallel to said word lines, said control lines connected so that a Yth control line which is connected to a control terminal of the Yth switching means of said first plurality of switching means is also connected to a control terminal of the Yth switching means of said second plurality of switching means.

8. A memory circuit comprising:
a first bit line separated into segments 1 through N, each segment having a section line connected thereto through a section select transistor and at least one memory cell connected thereto;
a second bit line parallel to said first bit line, said second bit line separated into segments 0 through N−1, each segment having a section line connected thereto through a section select transistor and at least one memory cell connected thereto;
a first plurality of switching means 1 through N, wherein a second terminal of said 1st switching means of said first plurality of switching means is connected to a first end of said 1st segment of said first bit line and said 2nd through Nth switching means of said first plurality of switching means are connected so that the Lth switching means of said first plurality of switching means has a first terminal connected to a second end of the Lth−1 segment of said first bit line and a second terminal connected to a first end of the Lth segment of said first bit line;
a second plurality of switching means 1 through N, wherein a first terminal of said Nth switching means of said second plurality of switching means is connected to a second end of said Nth−1 segment of said second bit line and said 1st through Nth−1 switching means of said second plurality of switching means are connected so that the Mth switching means of said second plurality of switching means has a second terminal connected to a first end of the Mth segment of said second bit line and a first terminal connected to a second end of the Mth−1 segment of said second bit line;
a first sense amplifier connected to a first terminal of said 1st switching means of said first plurality of switching means and said sense amplifier being connected to a first end of said 0th segment of said second bit line;
a second sense amplifier connected to a second terminal of said Nth switching means of said second plurality of switching means and said second sense amplifier being connected to a second end of said Nth segment of said first bit line;
a plurality of word lines running perpendicular to said first and second bit lines, each of said word lines connected so that a word line connected to a memory cell which is connected to the Xth segment of said first bit line is also connected to a memory cell connected to the Xth−1 segment of said second bit line; and a plurality of control lines 1 through N running parallel to said word lines, said control lines connected so that a Yth control line which is connected to a control terminal of the Yth switching means of said first plurality of switching means is also connected to a control terminal of the Yth switching means of said second plurality of switching means; and a plurality of section control lines 1 through N running parallel to said word lines, said section control lines connected so that the Kth control line of said plurality of section control lines is connected to the control terminals of the section select transistors connected to the Kth and Kth−1 segments of said first and second bit lines, respectively.

9. A memory circuit comprising:

a first bit line separated into segments 1 through N, each segment having at least one memory cell connected thereto;

a second bit line parallel to said first bit line, said second bit line separated into segments 0 through N−1, each segment having at least one memory cell connected thereto;

a first plurality of switching means 1 through N, wherein a second terminal of said first switching means of said first plurality of switching means is connected to a first end of said 1st segment of said first bit line and said 2nd through Nth switching means of said first plurality of switching means are connected so that the Kth switching means of said first plurality of switching means has a second terminal connected to a first end of the Kth segment of said first bit line and a first terminal of said Kth switching means of said first plurality of switching means connected to a second end of the Kth−1 segment of said first bit line;

a second plurality of switching means 1 through N, wherein a first terminal of said Nth switching means of said second plurality of switching means is connected to a second end of said Nth−1 segment of said second bit line and said 1st through Nth−1 switching means are connected so that the Lth switching means of said second plurality of switching means has a first terminal connected to a second end of the Lth−1 segment of said second bit line and a second terminal of said Lth switching means of said second plurality of switching means connected to a first end of the Lth segment of said second bit line;

a sense amplifier connected to a second terminal of said Nth switching means of said second plurality of switching means, said sense amplifier being connected to a second end of said Nth segment of said first bit line;

a third bit line separated into segments 1 through N, each segment having at least one memory cell connected thereto, said Nth segment being connected to said sense amplifier;

a fourth bit line parallel to said third bit line, said fourth bit line separated into segments 0 through N−1, each segment having at least one memory cell connected thereto;

a third plurality of switching means 1 through N, wherein a second terminal of said 1st switching means of said third plurality of switching means is connected to a first end of said 1st segment of said third bit line and said 2nd through Nth switching means of said third plurality of switching means are connected so that the Mth switching means of said third plurality of switching means has a second terminal connected to a first end of the Mth segment of said third bit line and a first terminal connected to a second end of the Mth−1 segment of said third bit line;

a fourth plurality of switching means 1 through N, wherein a first terminal of said Nth switching means of said fourth plurality of switching means is connected to a second end of said Nth−1 segment of said fourth bit line, a second terminal of said Nth switching means of said fourth plurality of switching means is connected to said sense amplifier and said 1st through Nth−1 switching means of said fourth plurality of switching means are connected so that the Jth switching means of said fourth plurality of switching means has a second terminal connected to a first end of the Jth segment of said fourth bit line and has a first terminal connected to a second end of the Jth−1 segment of said fourth bit line;

a plurality of word lines running perpendicular to said first, second, third and fourth bit lines, said word lines which are connected to a memory cell connected to the Xth segment of said first bit line being connected to a memory cell connected to the Xth−1 segment of said second bit line and said word lines which are connected to a memory cell connected to the Yth segment of said third bit line being connected to a memory cell connected to the Yth−1 segment of said fourth bit line;

a first plurality of control lines 1 through N running parallel to said word lines, said first plurality of control lines connected so that the control terminal of the Zth switching means of said first plurality of switching means is also connected to the control terminal of the Zth switching means of said second plurality of switching means;

a second plurality of control lines 1 through N running parallel to said word lines, said second plurality of control lines connected so that the control terminal of the Zth switching means of said third plurality of switching means is also connected to the control terminal of the Zth switching means of said fourth plurality of switching means and is connected to the Zth control line of said second plurality of control lines; and means for connecting said third bit line to said sense amplifier when a memory cell connected to said second bit line is addressed, for connecting said first bit line to said sense amplifier when a memory cell connected to said fourth bit line is addressed, for connecting said second bit line to said sense amplifier when a memory cell connected to said third bit line is addressed and for connecting said fourth bit line to said sense amplifier when a memory cell connected to said first bit line is addressed to provide a balancing bit line to said sense amplifier.

* * * * *